United States Patent [19]
Westwood

[11] Patent Number: 5,514,965
[45] Date of Patent: May 7, 1996

[54] METHOD AND APPARATUS FOR TESTING A COMMUNICATING LINE USING TIME DOMAIN REFLECTOMETRY

[75] Inventor: Matthew Westwood, Tewin, England

[73] Assignee: BICC Public Limited Company, London, England

[21] Appl. No.: 332,087

[22] Filed: Nov. 1, 1994

[30] Foreign Application Priority Data

Nov. 6, 1993 [GB] United Kingdom ............ 9322920

[51] Int. Cl.⁶ .................................................. G01R 31/11
[52] U.S. Cl. ........................ 324/533; 324/534; 324/642
[58] Field of Search ...................... 324/527, 528, 324/531, 532, 533, 534, 539, 543, 642; 379/26

[56] References Cited

U.S. PATENT DOCUMENTS

| | | | |
|---|---|---|---|
| 4,041,381 | 8/1977 | Hwa | 324/533 |
| 4,110,572 | 8/1978 | Cochrane | 324/527 X |
| 4,168,467 | 9/1979 | Bailey et al. | 324/76.82 X |
| 4,491,782 | 1/1985 | Bellis et al. | 324/533 |
| 4,766,386 | 8/1988 | Oliver et al. | 324/533 |
| 4,914,394 | 4/1990 | Meyer | 324/533 X |
| 5,382,910 | 1/1995 | Walsh | 324/533 |

FOREIGN PATENT DOCUMENTS

| | | |
|---|---|---|
| 0433020A2 | 6/1991 | European Pat. Off. . |
| 0539830A2 | 5/1993 | European Pat. Off. . |
| 4225595 | 9/1993 | Germany . |
| 1275374 | 5/1972 | United Kingdom . |

OTHER PUBLICATIONS

"Compact New Instrument Finds Undersea Cable Faults", *Electronics,* Sep. 14, 1962, pp. 48–50.
Brochure: Biccotest Digital Pulse Echo Cable Fault Locator, Model T353 (undated).

*Primary Examiner*—Kenneth A. Wieder
*Assistant Examiner*—Diep Do
*Attorney, Agent, or Firm*—Gary M. Nath; Anthony D. Miller; Nath & Associates

[57] ABSTRACT

A device for testing an electrical line by time domain reflectometry, using a pulse generator to generate a series of test pulses, a programmable delay generator which provides a delay in the transmission of the test pulses, and an analog to digital converter which samples the reflected signals from the line and sends them to memory. The test pulse is transmitted to the line and a number of digital sample values are produced sequentially at a defined sampling rate by the delay generator, which is incremented or decremented to advance or retard the transmission of the test pulse by 1/n times the sampling period, and sample values from each pulse obtained. The above steps are repeated until transmission of the test pulse has been retarded or advanced by at least (n–1)/n times the sampling period and sample values from each pulse obtained, with the sampled values arranged in order of increasing time difference between transmission of the test pulse and sampling.

8 Claims, 2 Drawing Sheets

METHOD AND APPARATUS FOR TESTING A COMMUNICATING LINE USING TIME DOMAIN REFLECTOMETRY

BACKGROUND OF THE INVENTION

1. Field of the Invention

This invention relates to devices for testing electrical lines, for example telephone lines, LANs, CATV lines and the like, for faults by time domain reflectometry (TDR).

2. Brief Discussion of the Prior Art

TDR is a well known technique for testing lines in which, for example, one or more electrical test pulses are transmitted into the line at one end thereof, and the voltage on the line at the same end thereof is measured as a function of time after transmission of the test pulse. Any impedance mismatch in the line or at the termination of the other end of the line caused for example by a fault, will cause a reflection of the test pulse to be detected at a time after transmission of the test pulse that corresponds to the position of the impedance mismatch along the line.

SUMMARY OF THE INVENTION

It is an object of the present invention to provide an improved device of this type, and especially one which is able to resolve the position of an impedance mismatch in the line to be tested to a relatively short distance.

According to the present invention, there is provided a device for testing an electrical line by time domain reflectometry, which comprises:

(i) a pulse generator for generating a series of test pulses;

(ii) a programmable delay generator which provides a delay in transmission of the test pulses to the line; and (iii) an analogue-to-digital converter which samples reflected signals from the line, digital sample values produced thereby being sent to a memory;

the arrangement being such that, in use, the line is tested in a test sequence in which:

(a) a test pulse is transmitted to the line and a number of digital sample values are produced sequentially at a defined sampling rate;

(b) the delay generator is incremented or decremented to retard or advance transmission of the test pulse to the line by 1/n times the sampling period (where n is an integer greater than one);

(c) steps (a) and (b) are repeated until transmission of the test pulse has been retarded or advanced by at least (n−1)/n times the sampling period and sample values from each pulse obtained; and (d) the sample values are rearranged in order of increasing time difference between transmission of the test pulse and sampling, and are displayed.

The device according to the invention has the advantage that not only is the minimum increment of time between the test pulse and sampling, and hence the spatial resolution of the device, not limited by the time taken for the A/D conversion, but it is not even limited by the clock frequency of any clock used for timing of the device: it is simply limited by the minimum delay increment of the delay generator. Thus it is possible for the delay generator to retard or advance transmission of the test pulse by a fraction of the clock period. Preferably transmission of the test pulse is retarded or advanced by less than half, and especially by not more than one quarter of the clock period. By this means it is possible for difference between the test pulse and the sample time to be incremented in steps of 10 ns, corresponding to a spatial resolution of 1 meter at a line speed of 200 $Mms^{-1}$, or less, while employing a relatively slow timing clock running at, say, 25 MHz. If the test difference between the pulse and the sampling time were incremented by the clock, a much faster clock, for example about 100 MHz would be required (or a 50 MHz clock which both edges are used) which would give rise to severe difficulties in guaranteeing set-up times of the logic in the circuit under worst case conditions. It is also possible according to the invention to reduce the time increment further, e.g. to 3 ns, which corresponds to a spatial resolution of about 300 mm, or less, for example to 1 ns or less, or even to 0.5 ns or less.

Normally the delay generator will be a digitally programmable delay generator in which case the delay in transmission of the test pulse over the entire test sequence could be generated by programming the delay generator. However, it is advantageous to include an offset counter, which controls the timing of the delay generator. Thus, for example, the delay generator may be programmed to increment or decrement until the delay becomes an integral value of the clock period, whereupon the offset counter will retard the delay generator by one clock period and the delay generator itself will be reset to zero delay. Such an arrangement has the advantage that it combines high resolution due to the ability of the delay generator to alter the delay by very small increments, with high accuracy of the overall delay. Also the accuracy of the delay is independent of the range. For large delays, only a small part of the delay (less than one clock period) is provided by the relatively inaccurate delay generator, and most of the delay is provided by the offset counter controlled by the much more accurate clock.

A number of circuits may be employed to provide the delay, for example LC circuits or silicon delay lines. One circuit that can provide a very small delay increment has a D/A convertor that converts a digital input into an analogue value that is fed into one input of a comparitor, while the other input is ramped.

In order to provide a delay in transmission of the test pulses, it is possible for example where a square wave test pulse is employed to delay the pulse itself, i.e. between generation and transmission of the pulse. Alternatively it is possible to delay generation of the test pulse, e.g. to delay the trigger that is sent to the pulse generator. Such an arrangement is preferred where pulses other than square wave pulses, e.g. sine squared pulses, are employed.

It is possible for the device to be arranged so that it can be set manually to different ranges of line length, in which case the test pulse width, and hence energy, will be selected depending on the range chosen. However, it is also possible for the device to display the sample values over the entire range of the device simultaneously, in which case it may be appropriate to employ test pulses of different widths to observe different parts of the line in order to accommodate attenuation of the test pulse and reflections by the line. In such a case, only some of the digital sample values in each test sequence which correspond to a region of the line are retained as valid sample values and groups of valid sample values which correspond to different regions of the line and which have been obtained different test sequences are displayed.

According to a second aspect, the invention provides in a method of testing an electrical line by time domain reflectometry, by means of a device which comprises;

(i) a pulse generator (1) for generating a series of test pulses;

(ii) a programmable delay generator (2) which provides a delay in transmission of the test pulses before they are transmitted to the line; and (iii) an analogue-to-digital converter (4) which samples reflected signals from the line, digital sample values produced thereby being sent to a memory;

wherein the method comprises employing a test sequence in which;

(a) a test pulse is transmitted to the line and a number of digital sample values are produced sequentially at a defined sampling rate;

(b) the delay generator (2) is incremented or decremented to retard or advance transmission of the test pulse to the line by 1/n times the sampling period (where n is an integer greater than one);

(c) steps (a) and (b) are repeated until transmission of the test pulse has been retarded or advanced by at least (n−1)/n times the sampling period and sample values from each pulse obtained; and (d) the sample values are rearranged in order of increasing time difference between transmission of the test pulse and sampling, and are displayed. Three devices according to the present invention will now be described by way of example with reference to the accompanying drawings in which:

DETAILED DESCRIPTION OF THE DRAWINGS

Figure 1:
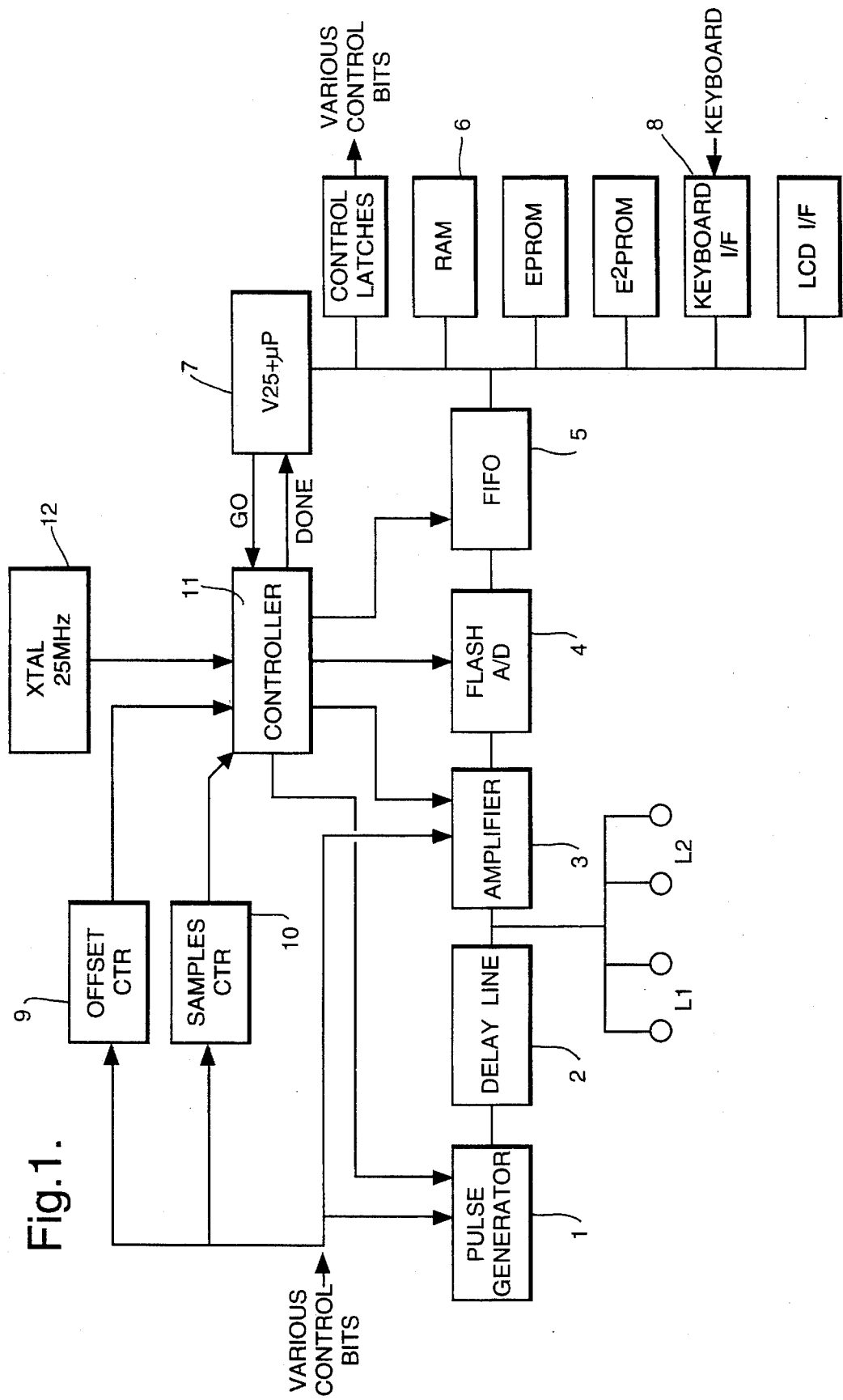
FIG. 1 is a schematic of the circuit of the first two forms of device.

Referring to the accompanying drawing, one form of device for testing a line comprises a pulse generator 1 that can generate square wave pulses of varying width between 80 ns and 3 μs. and a digitally programmable delay generator 2, which delays the pulses before they are transmitted to the line L1. A differential amplifier 3 amplifies the reflected signals from the line before they are converted into digital form by a parallel encoded (flash) analogue-to-digital converter 4 and temporarily stored in an asynchronous buffer 5 before being sent to RAM 6 that is controlled by a microprocessor 7.

In operation, when the test sequence starts, control bits are sent to set up counters 9 and 10, the pulse generator 1 and other components of the device, and a "GO" signal is sent to a programmable logic controller 11. Initially the delay generator 2 is set to give a 70 ns delay, and a 80 ns wide pulse is generated by the pulse generator 1. A series of 500 samples, which are of reflected signals, are digitized by the A/D converter 4 at 80 ns intervals and fed into the buffer 5. Of these sample values only eight are "valid", i.e. corresponding to a distance along the line appropriate for the pulse width used. After the sample values have been collected they are sent to RAM 6 by direct memory access until the valid sample values have been stored in the RAM. The delay generator is then decremented by 10 ns thereby increasing the pulse transmission/sample acquisition time difference by 10 ns, and another pulse is transmitted and sample values obtained and stored. This operation is repeated until the delay generator has been decremented to zero delay and sample values from that pulse have been obtained and stored in RAM 6. The delay generator is then reset to 70 ns and a new series of sample values is obtained using a slightly wider pulse which is appropriate for observing signals from a different position along the line. The procedure of gradually increasing the pulse width and taking samples over the range of delay values is repeated over a range of 64 pulse widths in which the pulse widths vary gradually from 80 ns to 1 μs. This takes a total of about 0.1 to 0.2 seconds, after which the amplifier and A/D convertor are turned off to conserve battery power. The microprocessor 7 then rearranges the sample values in RAM 6 into order corresponding to increasing distance along the line and then displays the values in analogue form on a liquid crystal display. The entire procedure is repeated once per second so that variations in the line over time may be monitored.

A second form of device has the same general form as that described above and shown in the drawing with the exception that a 41.6 MHz clock 12 is employed instead of a 25 MHz clock and that the sample interval of A/D convertor is 96 ns instead of 80 ns. In this device the delay is incremented or decremented in eight steps of 3 ns to give a total delay of 24 ns or one clock pulse. Offset counter 9 delays the pulse generator 1 by 0, 1,2 or 3 clock pulses to enable the 96 ns sample interval to be incremented in 3 ns steps.

In addition, the device can have various range settings that can be manually selected so that a single pulse width can be used within each range setting. Because of this, all the sample values that are generated by the A/D convertor can be regarded as "valid" and no repetition of the data acquisition procedure with different pulse widths is necessary.

Figure 2:
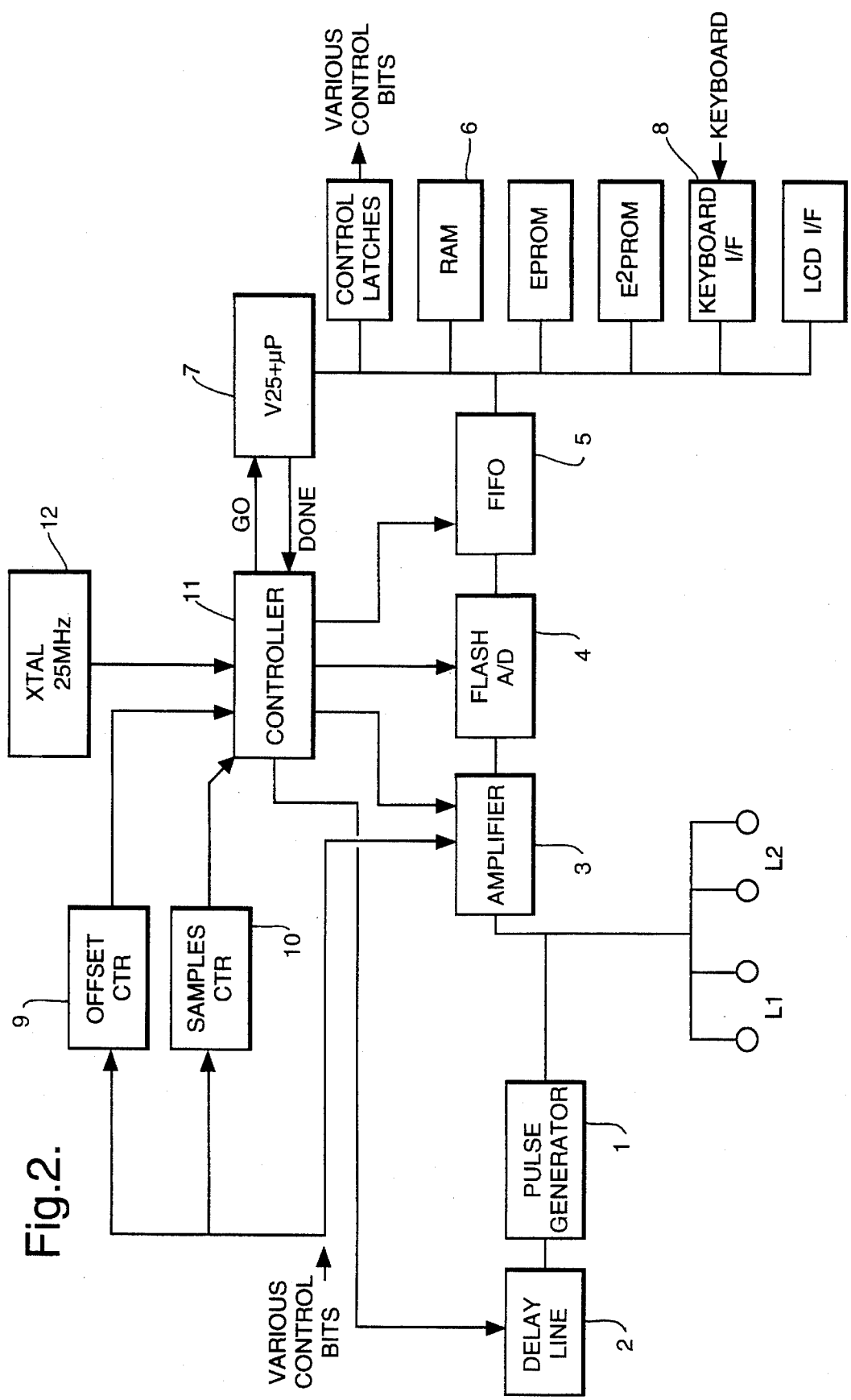
FIG. 2 is a schematic of an alternative form of device.

An alternative form of device is shown in FIG. 2 which is the same as that shown in FIG. 1, with the exception that, instead of generating a square wave pulse, the pulse generator 1 generates a series of sine squared pulses. Because of this the delay generator is located in front of the pulse generator so that the digital signal sent from the controller 11 to the pulse generator 1 is delayed rather than the pulse itself which is analogue.

I claim:

1. A device for testing an electrical line by time domain reflectometry, the device comprising:

(i) a pulse generator for generating a series of test pulses which are applied to the electrical line;

(ii) a memory;

(iii) a programmable delay generator which provides a delay in transmission of said test pulses before the test pulses are transmitted to the electrical line; and (iv) an analogue-to-digital converter A which samples signals reflected from said electrical line and converts said signals into digital sample values, said digital sample values are sent to said memory;

such that, in use, the line is tested in a test sequence in which:

(a) a test pulse is transmitted to the line and a number of digital sample values of the reflected signals are produced by the analogue-to-digital converter sequentially at a defined sampling rate;

(b) the delay generator is incremented or decremented to retard or advance transmission of the test pulse to the line by 1/n times the sampling period (where n is an integer greater than one);

(c) steps (a) and (b) are repeated until transmission of the test pulse has been retarded or advanced by at least (n−1)/n times the sampling period and sample values from each pulse obtained; and (d) the sample values are rearranged in order of increasing time difference between transmission of the test pulse and sampling, and are displayed.

2. A device as claimed in claim 1, wherein the timing of the device is controlled by a clock and the delay generator retards or advances transmission of the test pulse by less than half the clock period.

3. A device as claimed in claim 2, wherein the delay generator retards or advances transmission of the test pulse by not more than one quarter of the clock period.

4. A device as claimed in claim 2, which includes an offset counter whose timing is controlled by the clock, and which controls the timing of the delay generator.

5. A device as claimed in claim 1 wherein the line is tested in a plurality of test sequences, each of which employs test pulses of a different pulse width.

6. A device as claimed in claim 5, wherein, in each test sequence, only some of the digital sample values, which correspond to a single region of the line, are retained as valid sample values, and groups of valid sample values which correspond to different regions of the line and which have been obtained from different test sequences are displayed.

7. A device as claimed in claim 3, which includes an offset counter whose timing is controlled by the clock, and which controls the timing delay generator.

8. A method of using a device to test an electrical line by time domain reflectometry, the device comprising (i) a pulse generator for generating a series of test pulses; (ii) a programmable delay generator which provides a delay in transmission of the test pulses before they are transmitted to the line; and (iii) an analogue-to-digital converter which samples reflected signals from the line, digital sample values produced thereby being sent to a memory; the method comprising the steps of:

(a) transmitting a test pulse to the line and producing a number of digital sample values sequentially at a defined sampling rate;

(b) incrementing or decrementing a delay generator to retard or advance transmission of the test pulse to the line by 1/n times the sampling period, wherein n is an integer greater than one;

(c) repeating steps (a) and (b) until transmission of the test pulse has been retarded or advanced by at least (n−1)/n times the sampling period and sample values from each pulse obtained; and (d) rearranging the sample values in order of increasing time difference between transmission of the test pulse and sampling, and are displayed.

* * * * *